US009598285B2

(12) United States Patent
Shibuya et al.

(10) Patent No.: US 9,598,285 B2
(45) Date of Patent: Mar. 21, 2017

(54) APPARATUS FOR PRODUCING ALIGNED CARBON NANOTUBE AGGREGATES

(75) Inventors: Akiyoshi Shibuya, Tokyo (JP); Keiichi Kawata, Tokyo (JP); Kenji Hata, Tsukuba (JP); Motoo Yumura, Tsukuba (JP)

(73) Assignees: ZEON CORPORATION, Tokyo (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 257 days.

(21) Appl. No.: 13/148,619

(22) PCT Filed: Feb. 8, 2010

(86) PCT No.: PCT/JP2010/000743
§ 371 (c)(1),
(2), (4) Date: Aug. 9, 2011

(87) PCT Pub. No.: WO2010/092787
PCT Pub. Date: Aug. 19, 2010

(65) Prior Publication Data
US 2011/0308462 A1 Dec. 22, 2011

(30) Foreign Application Priority Data
Feb. 10, 2009 (JP) ................. 2009-029128

(51) Int. Cl.
C23C 16/26 (2006.01)
C23C 16/44 (2006.01)
(Continued)

(52) U.S. Cl.
CPC ......... *C01B 31/0226* (2013.01); *B01J 15/005* (2013.01); *B01J 19/088* (2013.01);
(Continued)

(58) Field of Classification Search
CPC ................. H01L 21/67173; C23C 16/545
(Continued)

(56) References Cited

U.S. PATENT DOCUMENTS 5,747,119 A * 5/1998 Hirata ........................ 427/585
2002/0100423 A1* 8/2002 Shibasaki ............... C23C 14/50
118/723 MW (Continued)

FOREIGN PATENT DOCUMENTS

JP 2003-171108 A 6/2003
JP 2006-16232 A 1/2006
(Continued)

OTHER PUBLICATIONS

K. Hata et al., "Water-Assisted Highly Efficient Synthesis of Impurity-Free Single-Walled Carbon Nanotubes", Science, Nov. 19, 2004, vol. 306, p. 1362-1364.
(Continued)

*Primary Examiner* — Parviz Hassanzadeh
*Assistant Examiner* — Nathan K Ford
(74) *Attorney, Agent, or Firm* — Birch, Stewart, Kolasch & Birch, LLP

(57) ABSTRACT

An apparatus of the present invention for producing aligned carbon nanotube aggregates is an apparatus for producing aligned carbon nanotube aggregates, the apparatus being configured to grow the aligned carbon nanotube aggregate by: causing a catalyst formed on a surface of a substrate to be surrounded by a reducing gas environment constituted by a reducing gas; heating at least either the catalyst or the reducing gas; causing the catalyst to be surrounded by a raw material gas environment constituted by a raw material gas; and heating at least either the catalyst or the raw material gas, at least either an apparatus component exposed to the reducing gas or an apparatus component exposed to the raw
(Continued)

material gas being made from a heat-resistant alloy, and having a surface plated with molten aluminum.

1 Claim, 2 Drawing Sheets

(51) Int. Cl.
*B82Y 40/00* (2011.01)
*C01B 31/02* (2006.01)
*B01J 15/00* (2006.01)
*B01J 19/08* (2006.01)
*B01J 19/12* (2006.01)
*B01J 19/22* (2006.01)
*B82Y 30/00* (2011.01)
*C23C 16/46* (2006.01)

(52) U.S. Cl.
CPC ............. *B01J 19/126* (2013.01); *B01J 19/22* (2013.01); *B82Y 30/00* (2013.01); *B82Y 40/00* (2013.01); *C01B 31/022* (2013.01); *C01B 31/024* (2013.01); *C23C 16/26* (2013.01); *C23C 16/46* (2013.01); *B01J 2219/0009* (2013.01); *B01J 2219/00094* (2013.01); *B01J 2219/00123* (2013.01); *B01J 2219/00135* (2013.01); *B01J 2219/00139* (2013.01); *B01J 2219/00148* (2013.01); *B01J 2219/00159* (2013.01); *B01J 2219/00164* (2013.01); *B01J 2219/0894* (2013.01); *C01B 2202/08* (2013.01)

(58) Field of Classification Search
USPC .................................................. 118/718, 719
See application file for complete search history.

(56) References Cited

U.S. PATENT DOCUMENTS

| | | | |
|---|---|---|---|
| 2004/0089237 A1* | 5/2004 | Pruett et al. ................... | 118/719 |
| 2005/0238810 A1* | 10/2005 | Scaringe et al. ............ | 427/249.1 |
| 2007/0092431 A1 | 4/2007 | Resasco et al. | |
| 2008/0241379 A1* | 10/2008 | Suzuki et al. ............ | 427/255.15 |
| 2008/0241517 A1* | 10/2008 | Kenworthy et al. .......... | 428/332 |
| 2008/0274036 A1 | 11/2008 | Resasco et al. | |
| 2009/0162551 A1* | 6/2009 | Zilbauer et al. ......... | 427/255.28 |
| 2010/0062157 A1 | 3/2010 | Hata et al. | |
| 2011/0045179 A1 | 2/2011 | Resasco et al. | |

FOREIGN PATENT DOCUMENTS

| | | |
|---|---|---|
| JP | 2007-91556 A | 4/2007 |
| JP | 2007-92152 A | 4/2007 |
| KR | 2008-0094884 A | 10/2008 |
| WO | WO 2004/007353 A2 | 1/2004 |
| WO | WO 2007/141558 A2 | 12/2007 |
| WO | WO 2008/096699 A1 | 8/2008 |

OTHER PUBLICATIONS

PCT/ISA/210 for PCT/JP2010/000743 dated Mar. 23, 2010.
Extended European Search Report for European Application No. 10741067.2, dated Oct. 30, 2015.

* cited by examiner

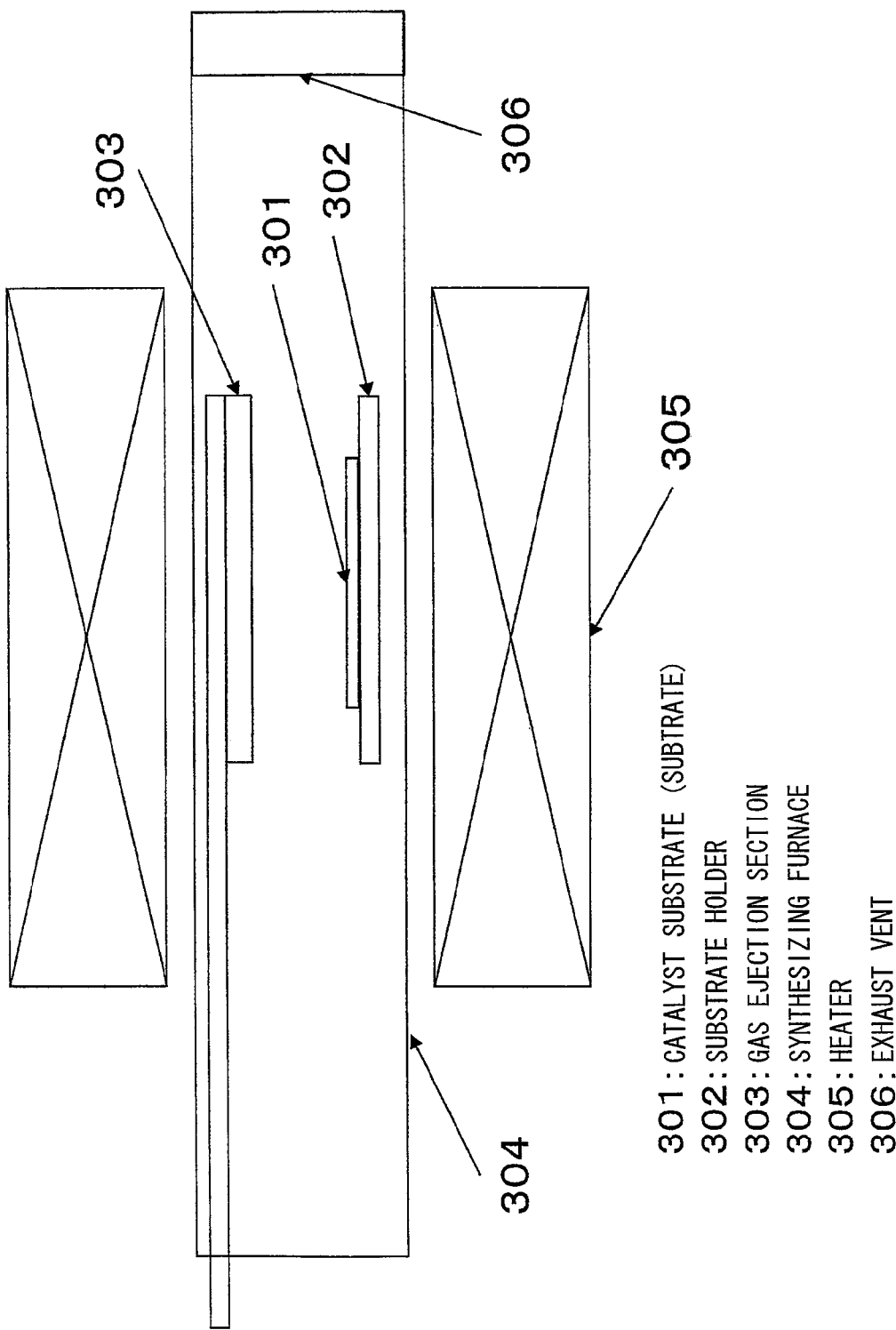

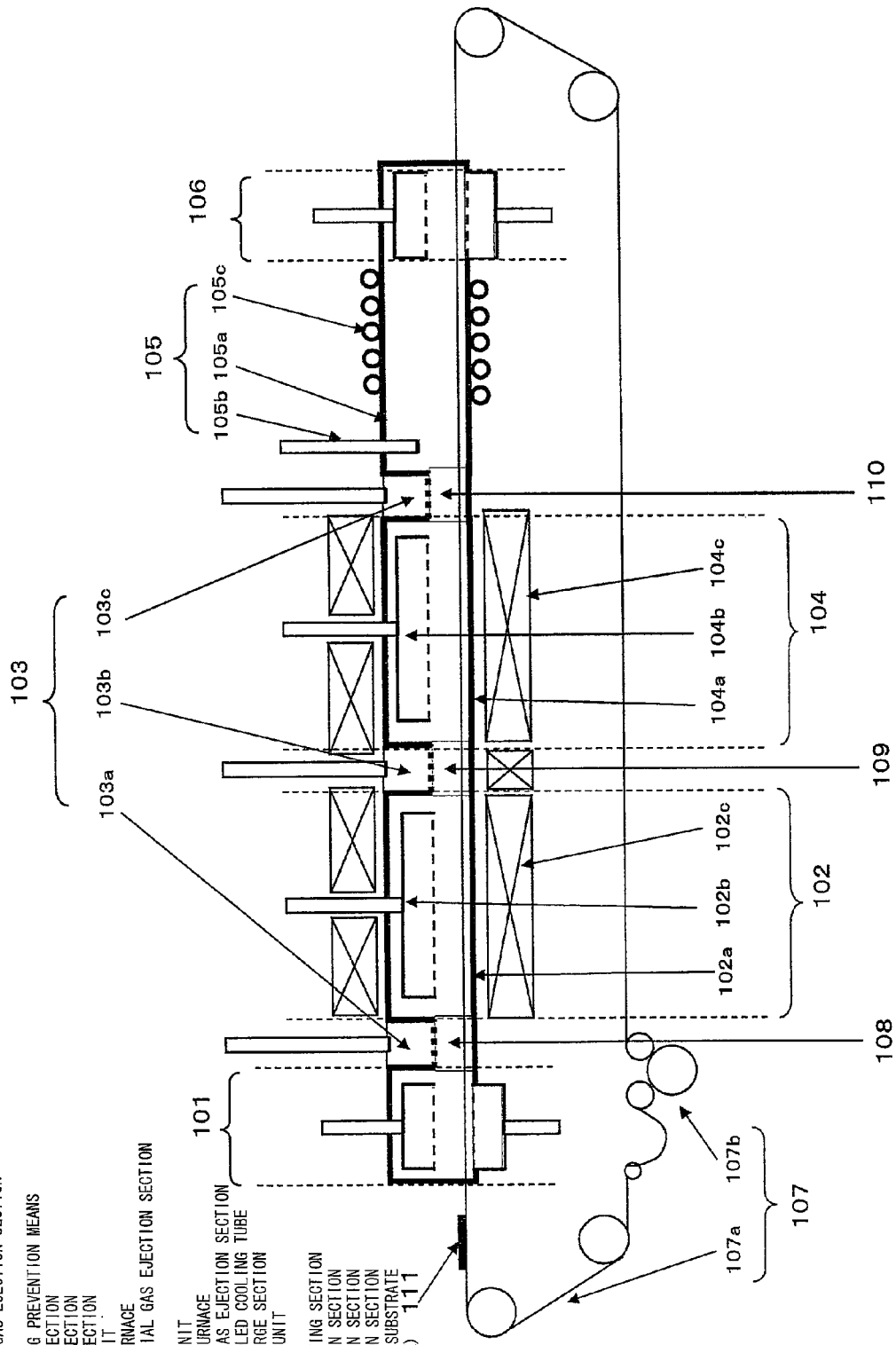

F I G. 2

101 : INLET PURGE SECTION
102 : FORMATION UNIT
102a: FORMATION FURNACE
102b: REDUCING GAS EJECTION SECTION
102c: HEATER
103 : GAS MIXING PREVENTION MEANS
103a: EXHAUST SECTION
103b: EXHAUST SECTION
103c: EXHAUST SECTION
104 : GROWTH UNIT
104a: GROWTH FURNACE
104b: RAW MATERIAL GAS EJECTION SECTION
104c: HEATER
105 : COOLING UNIT
105a: COOLING FURNACE
105b: COOLANT GAS EJECTION SECTION
105c: WATER-COOLED COOLING TUBE
106 : OUTLET PURGE SECTION
107 : TRANSFER UNIT
107a: MESH BELT
107b: BELT DRIVING SECTION
108 : CONNECTION SECTION
109 : CONNECTION SECTION
110 : CONNECTION SECTION
111 : CATALYST SUBSTRATE
      (SUBSTRATE)

APPARATUS FOR PRODUCING ALIGNED CARBON NANOTUBE AGGREGATES

TECHNICAL FIELD

The present invention relates to apparatuses for producing aligned carbon nanotube aggregates and, in particular, to an apparatus for producing aligned carbon nanotube aggregates, the apparatus being capable of remarkably improving production efficiency without entailing deterioration in quality during serial production.

BACKGROUND ART

Carbon nanotubes (hereinafter referred to also as "CNTs") are carbon structures each structured such that a carbon sheet composed of carbon atoms arranged hexagonally on its plane is looped into a cylindrical shape. The CNTs are classified into single-walled CNTs and multiwall CNTs. Regardless of whether being single-walled or multiwall, the CNTs are expected to develop into functional materials such as electronic device materials, optical element materials, and conducting materials because of their mechanical strength, optical properties, electrical properties, thermal properties, and molecular-adsorbing functions, etc.

Among the CNTs, the single-walled CNTs are excellent in various properties such as electrical properties (extremely high in current density), heat properties (comparable in specific thermal conductivity to diamonds), optical properties (emit light in an optical communication band of wavelengths), hydrogen storage capability, and metal catalyst supporting capability. Moreover, the single-walled CNTs exhibit the properties of both semiconductors and metals, and therefore have drawn attention as materials for nanoelectronics devices, nanooptical elements, energy storage bodies and the like.

In the case of making efficient use of the CNTs for these purposes, it is desirable that a plurality of CNTs be aligned along a particular direction to form an aggregate in the form of a bundle, a film, or a mass, and that the CNT aggregate exhibit functionalities such as electric/electronic functionalities and optical functionalities. Further, it is preferable that the CNT aggregate be larger in height (length). It is predicted that creation of such an aligned CNT aggregate will lead to a dramatic expansion in the field of application of the CNTs.

A known method for producing such CNTs is a chemical vapor deposition method (hereinafter referred to also as "CVD method") (e.g., see Patent Literature 1). This method is characterized in bringing a carbon-containing gas (hereinafter referred to as "raw material gas") into contact with a catalyst, i.e., fine metal particles in a hot atmosphere of approximately 500° C. to 1000° C., and as such, makes it possible to produce the CNTs with variations in aspects such as the kind and arrangement of the catalyst or the kind and condition of reaction of the carbon compound. The CVD method is, therefore highly expected as being suitable to mass production of the CNTs. Further, the CVD method has the advantages of: being capable of producing both single-walled carbon nanotubes (SWCNTs) and multiwall carbon nanotubes (MWCNTs); and being capable of, by use of a substrate supporting a catalyst, producing a large number of CNTs aligned perpendicularly to a surface of the substrate.

The CVD method includes a CNT synthesis step. This CNT synthesis step may be divided into a formation step and a growth step, in which case a metal catalyst supported by a substrate is reduced by being exposed to a hot hydrogen gas (hereinafter referred to as "reducing gas") in the formation step, and then in the growth step the CNTs are synthesized by bringing the catalyst into contact with a raw material gas containing a catalyst activation material. The formation step and the growth step are executed in a single furnace to avoid exposure of the reduced catalyst to the outside air between the formation step and the growth step.

In the case of a normal CVD method, fine catalyst particles are covered with carbonaceous impurities generated in the process of synthesis of the CNTs; therefore, the catalyst is easily deactivated, and the CNTs cannot grow efficiently. For this reason, it is common to synthesize the CNTs in an atmosphere of low-carbon concentration with the volume fraction of a raw material gas kept to approximately 0.1% to 1% during the CVD. Since the amount of the raw material gas supplied is proportional to the production quantity of the CNTs, the synthesis of the CNTs in an atmosphere of as high-carbon concentration as possible is directly linked to improvement in production efficiency.

In recent years, there has been proposed a technique for the CVD method that remarkably increases the activity and a life of a catalyst by bringing a catalyst activation material such as water, as well as a raw material gas, into contact with the catalyst (such a technique being hereinafter referred to as "super-growth method"; see Non-Patent Literature 1). A catalyst activation material is believed to have an effect of cleansing the outer layer of a catalyst by removing carbonaceous impurities covering fine catalyst particles, and such an effect is believed to remarkably increase the activity and a life of the catalyst. Actually, there has been a case of success in remarkably improving efficiency in production of the CNTs by preventing deactivation of the catalyst even in such an environment of high-carbon concentration (approximately 2% to 20% of the volume fraction of the raw material gas during the CVD) that the catalyst would normally be deactivated. CNTs that are synthesized by applying the super-growth method to a substrate supporting a catalyst have the features of: being large in specific surface area, forming an aggregate of CNTs each aligned along a regular direction; and being low in bulk density (such an aggregate being hereinafter referred to as "aligned CNT aggregate").

Conventionally, CNT aggregates are very high in aspect ratio and one-dimensional elongated flexible substances, and because of their strong van der Waals' force, are likely to constitute random and non-aligned aggregates that are small in specific surface area. Because it is extremely difficult to restructure the orientation of an aggregate that is once random and non-aligned, it has been difficult to produce a CNT aggregate that is large in specific surface area with moldability and processability. However, the super-growth method has made it possible to produce aligned CNT aggregates that are large in specific surface area, have orientation, and can be molded and processed into various forms and shapes, and such aligned CNT aggregates are believed to be applicable as substance/energy storage materials for various uses such as super-capacitor electrodes and directional heat-transfer/heat-dissipation materials.

Conventionally, there have been proposed various production apparatuses for carrying out serial production of the CNTs by the CVD method, a known example thereof being a technique for transferring a series of substrates into a synthesis furnace with use of transferring means such as a belt conveyor or a turntable (see Patent Literatures 2 to 4). However, it was found that in the case of serial production of aligned CNT aggregates with use of the super-growth method, there are technical problems specific to high-carbon environment and/or a catalyst activation material, although there were no such problems with the conventional synthetic method.

CITATION LIST

Patent Literatures

[Patent Literature 1] Japanese Patent Application Publication, Tokukai, No. 2003-171108 A (Publication Date: Jun. 17, 2003)
[Patent Literature 2] Japanese Patent Application Publication, Tokukai, No. 2006-16232 A (Publication Date: Jan. 19, 2006)
[Patent Literature 3] Japanese Patent Application Publication, Tokukai, No. 2007-91556 A (Publication Date: Apr. 12, 2007)
[Patent Literature 4] Japanese Patent Application Publication, Tokukai, No. 2007-92152 A (Publication Date: Apr. 12, 2007)

Non-Patent Literatures

[Non-Patent Literature 1] HATA, K. et al.: "Water-Assisted Highly Efficient Synthesis of Impurity-Free Single-Walled Carbon Nanotubes", Science, Nov. 19, 2004, Vol. 30 6, p. 1362-1364

SUMMARY OF INVENTION

Technical Problem

Production of aligned CNT aggregates by the super-growth method causes carbonaceous by-products other than CNTs (hereinafter referred to as "carbon contaminants"), such as amorphous carbon and graphite, to adhere in large quantities to a wall surface of a furnace. This is because the super-growth method puts a raw material gas in an environment of high-carbon concentration, and such adhesion of carbon contaminants becomes more prominent in the case of serial production. There has empirically been known such a problem that accumulation of a certain amount of carbon contaminants in the furnace as a result of serial production leads to a decrease in production quantity and deterioration in quality of the aligned CNT aggregates.

Conventionally, such a problem has been solved by a method for removing the carbon contaminants by introducing an oxygen-containing gas (air) into the furnace (such a method being hereinafter referred to as "heated air cleaning"), heating the furnace, and thereby gasifying the carbon contaminants. Unfortunately, such an operation interrupts production, thus causing a decrease in production efficiency.

Such heated air cleaning is effective when the furnace wall is composed of quartz, but impracticably causes problems when the furnace wall is composed of a metal such as a heat-resistant alloy, because the heated air cleaning oxidizes the furnace wall surface and therefore causes generation of metal-oxide scale. In particular, a heat-resistant alloy that is once carburized shows a remarkable decrease in oxidation resistance. Since the condition for the growth step of the super-growth method is a high-carbon environment, the furnace wall surface is more likely to be carburized, and shows a remarkable decrease in oxidation resistance. Heated air cleaning of a carburized furnace wall causes carbonaceous by-products such as amorphous carbon and graphite to be gasified and therefore removed, but the furnace wall surface is oxidized, whereby metal-oxide scale is generated on and peels off from the furnace wall surface. It has been found that production in an oxidized furnace causes a large amount of carbon to adhere to the oxidized wall surface and the metal-oxide scale, thus leading markedly to the decrease in production quantity and deterioration in quality of the aligned CNT aggregates.

Quartz is stable at high temperatures and less likely to emit impurities, and as such, is often used as a wall material for a CNT synthesis furnace. However, quartz is not high in processing precision and degree of flexibility in processing and is vulnerable to shock. One effective way of further improving the efficiency in the production of the CNTs is to increase the size of the synthesis furnace. However, because of such shortcomings of quartz, it is very difficult to use a larger apparatus in its size. Moreover, because heated air cleaning cannot be applied when a metal is used as the wall material, it is impossible to solve problems with the decrease in production quantity and deterioration in quality of the aligned CNT aggregates.

The following are two possible main factors in a mechanism by which the carbon contaminants in the furnace cause the decrease in production quantity and deterioration in quality of the aligned CNT aggregates.

1. Chemical Reaction Between a Reducing Gas and the Carbon Contaminants in the Formation Step Since the formation step and the growth step are continuously repeated in the same furnace, those carbon contaminants which adhere to the furnace wall in the growth step have been exposed to the reducing gas in the formation step. At a high temperature of approximately 800° C., the carbon contaminants and hydrogen contained in the reducing gas react with each other chemically to generate hydrocarbon gas (mainly methane gas). An increase in carbon contaminants that adhere to the furnace wall leads to an increase in amount of hydrocarbon gas that is generated from the carbon contaminants, and therefore starts to inhibit catalyst reduction necessary for CNT growth, thus causing the decrease in production quantity and deterioration in quality of the aligned CNT aggregates.

2. Chemical Reaction Between a Catalyst Activation Material and the Carbon Contaminants in the Growth Step Those carbon contaminants which have adhered to the furnace wall make contact with the catalyst activation material in the growth step. At a high temperature of approximately 800° C., the carbon contaminants and the catalyst activation material react with each other chemically to generate an oxygen-containing gas, such as carbon monoxide or carbon dioxide, which has a small carbon number. Accumulation of carbon contaminants adherent to the furnace wall leads to an increase in amount of the catalyst activation material that reacts chemically with the carbon contaminants, whereby gas composition of a raw material gas environment deviates from a condition optimum for the CNT growth. This causes the decrease in production quantity and deterioration in quality of the aligned CNT aggregates.

The present invention has been devised to solve such inconveniences as caused by the conventional techniques, and it is a main object of the present invention to provide a production apparatus capable of improving an efficiency in the production of the aligned CNT aggregates by preventing the decrease in production quantity and deterioration in quality of the aligned CNT aggregates in serial production and by making it easy to use a larger apparatus in its size.

Solution to Problem

In order to attain such an object, an apparatus in one exemplary aspect of the present invention for producing aligned carbon nanotube aggregates, the apparatus being configured to grow the aligned carbon nanotube aggregate by: causing a catalyst formed on a surface of a substrate to be surrounded by a reducing gas environment constituted by a reducing gas; heating at least either the catalyst or the reducing gas; causing the catalyst to be surrounded by a raw material gas environment constituted by a raw material gas; and heating at least either the catalyst or the raw material gas, at least either an apparatus component exposed to the reducing gas or an apparatus component exposed to the raw material gas being made from a heat-resistant alloy, and having a surface plated with molten aluminum.

Further, an apparatus in another exemplary aspect of the present invention for producing aligned carbon nanotube aggregates, the apparatus being configured to grow the aligned carbon nanotube aggregate by: causing a catalyst formed on a surface of a substrate to be surrounded by a reducing gas environment constituted by a reducing gas; heating at least either the catalyst or the reducing gas; causing the catalyst to be surrounded by a raw material gas environment constituted by a raw material gas; and heating at least either the catalyst or the raw material gas, at least either an apparatus component exposed to the reducing gas or an apparatus component exposed to the raw material gas being made from a heat-resistant alloy, and having a surface polished so as to have an arithmetic average roughness Ra equal to or smaller than 2 µm.

For a fuller understanding of the nature and advantages of the invention, reference should be made to the ensuing detailed description taken in conjunction with the accompanying drawings.

Advantageous Effects of Invention

An apparatus of the present invention for producing aligned carbon nanotube aggregates, the apparatus being configured to grow the aligned carbon nanotube aggregate by: causing a catalyst formed on a surface of a substrate to be surrounded by a reducing gas environment constituted by a reducing gas; heating at least either the catalyst or the reducing gas; causing the catalyst to be surrounded by a raw material gas environment constituted by a raw material gas; and heating at least either the catalyst or the raw material gas, at least either an apparatus component exposed to the reducing gas or an apparatus component exposed to the raw material gas being made from a heat-resistant alloy, and having a surface plated with molten aluminum.

The apparatus of the present invention decreases quantity of carbon contaminants that adhere to the surface of the apparatus component thereby decreasing quantity of hydrocarbon gas (mainly methane gas) generated by chemical reaction of the carbon contaminants with the reducing gas in a formation step and therefore preventing the formation step from being inhibited. Further, the apparatus of the present invention decreases quantity of a catalyst activation material that chemically reacts with the carbon contaminants in a growth step thereby retaining an optimal condition for gas composition of the environment of the raw material gas in the growth step. It is accordingly possible to prevent a decrease in production quantity and deterioration in quality of the aligned CNT aggregate. Further, either the apparatus component exposed to the reducing gas or the apparatus component exposed to the raw material gas can be made from the heat-resistant alloy whereby the larger apparatus in its size can be easily used and therefore an efficiency in the production of the aligned CNT aggregate can be improved.

Further, individually providing a formation unit and a growth unit in the apparatus makes it possible to further prevent the carbon contaminants from adhering to an inner wall of a formation furnace. It is accordingly possible to further prevent the decrease in production quantity and deterioration in quality of the aligned CNT aggregate.

Further, an apparatus of the present invention for producing aligned carbon nanotube aggregates, the apparatus being configured to grow the aligned carbon nanotube aggregate by: causing a catalyst formed on a surface of a substrate to be surrounded by a reducing gas environment constituted by a reducing gas; heating at least either the catalyst or the reducing gas; causing the catalyst to be surrounded by a raw material gas environment constituted by a raw material gas; and heating at least either the catalyst or the raw material gas, at least either an apparatus component exposed to the reducing gas or an apparatus component exposed to the raw material gas being made from a heat-resistant alloy, and having a surface polished so as to have an arithmetic average roughness Ra equal to or smaller than 2 µm.

The apparatus of the present invention decreases quantity of carbon contaminants that adhere to the surface of the apparatus component thereby decreasing quantity of hydrocarbon gas (mainly methane gas) generated by chemical reaction of the carbon contaminants with the reducing gas in a formation step and therefore preventing the formation step from being inhibited. Further, the apparatus of the present invention decreases quantity of a catalyst activation material that chemically reacts with the carbon contaminants in a growth step thereby retaining an optimal condition for gas composition of the environment of the raw material gas in the growth step. It is accordingly possible to prevent a decrease in production quantity and deterioration in quality of the aligned CNT aggregate.

Further, either the apparatus component exposed to the reducing gas or the apparatus component exposed to the raw material gas can be made from the heat-resistant alloy whereby the apparatus can be easily increased in its size and therefore an efficiency in the production of the aligned CNT aggregate can be improved.

Further, individually providing a formation unit and a growth unit in the apparatus makes it possible to further prevent the carbon contaminants from adhering to an inner wall of a formation furnace. It is accordingly possible to further prevent the decrease in production quantity and deterioration in quality of the aligned CNT aggregate.

BRIEF DESCRIPTION OF DRAWINGS

FIG. 1 is a block diagram schematically showing a production apparatus (part I) of the present invention.

FIG. 2 is a block diagram schematically showing another production apparatus (part II) of the present invention.

DESCRIPTION OF EMBODIMENTS

The following describes in detail embodiments of the present invention.

(Aligned CNT Aggregate)

An aligned CNT aggregate that is produced in the present invention refers to a structure in which a large number of CNTs having grown from a substrate are aligned along a particular direction. A preferred specific surface area of the aligned CNT aggregate is not less than 600 $m^2/g$ when the CNTs are mostly unopened, or is not less than 1,300 $m^2/g$ when the CNTs are mostly opened. The aligned CNT aggregate having a specific surface area of not less than 600 m²/g with the CNTs unopened, and the aligned CNT aggregate having a specific surface area of not less than 1,300 m²/g with the CNTs opened are preferable because such aligned CNT aggregates contain less impurities such as metals or less carbon impurities (e.g., less than several tens of percent [approximately 40%] of the weight).

It is preferable that a weight density of the aligned CNT aggregate be not less than 0.002 g/cm³ but not more than 0.2 g/cm³. In a case where the weight density is not more than 0.2 g/cm³, there will be a weakening in binding of the CNTs constituting the aligned CNT aggregate. Such a weakening renders the aligned CNT aggregate likely to be homogenously dispersed when stirred into a solvent or the like. Alternatively, in a case where the weight density is not less than 0.002 g/cm³, an integrity of the aligned CNT aggregate is not decreased, and prevented from being unbound whereby the aligned CNT aggregate is easily handled.

It is preferable that the aligned CNT aggregate aligned along the particular direction have a great orientation. What is meant by the great orientation is:

1. In a case where the aligned CNT aggregate is irradiated with X rays from a first direction parallel with the longitudinal direction of the CNTs and from a second direction orthogonal to the first direction, and an x-ray diffraction intensity of the aligned CNT aggregate is measured (by θ-2θ method), a θ angle and a reflection direction where a reflection intensity from the second direction is greater than that from the first direction are obtained. Further, a θ angle and a reflection direction where the reflection intensity from the first direction is greater than that from the second direction are also obtained.

2. In a case where an X-ray diffraction intensity is measured from a two-dimensionally diffraction pattern image obtained by irradiating the aligned CNT aggregate with X rays from the direction orthogonal to the longitudinal direction of the CNTs (Laue method), a diffraction peak pattern indicating presence of anisotropy appears.

3. A Herman's orientation factor calculated on the basis of the X-ray diffraction intensity obtained by the θ-2θ method or the Laue method is more than 0 but less than 1, preferably not less than 0.25 but not more than 1.

The orientation of the aligned CNT aggregate can be evaluated by at least any one of the above methods 1 to 3. Further, according to the X-ray diffraction method, (i) diffraction intensities of a (CP) diffraction peak and a (002) peak based on packing between the single-walled CNTs, and (ii) a diffraction peak intensity in a direction of X-rays that enter parallel and perpendicular to (100) and (110) peaks based on a six-membered carbon ring constituting the single-walled CNTs are different from each other.

In order for the aligned CNT aggregate to exhibit an orientation and a large specific surface area, it is preferable that a height of the aligned CNT aggregate be in a range of not less than 10 μm but not more than 10 cm. The height of not less than 10 μm leads to an improvement in orientation. Alternatively, the height of not more than 10 cm makes it possible to improve the specific surface area, because such a height makes rapid generation possible, and adhesion of carbonaceous impurities is therefore prevented.

(Substrate)

The substrate is a member capable of supporting a catalyst for carbon nanotubes on a surface thereof, and can maintain its shape even at a high temperature of not lower than 400° C. Any type of substrates that is usable for production of the CNTs can be used. Examples of materials include: metals such as iron, nickel, chromium, molybdenum, tungsten, titanium, aluminum, manganese, cobalt, copper, silver, gold, platinum, niobium, tantalum, lead, zinc, gallium, indium, gallium, germanium, indium, and antimony; alloys and oxides containing these metals; nonmetals such as silicon, quartz, glass, mica, graphite, and diamond; and ceramic. The metal materials are preferable because the metal materials are lower in cost than silicon and ceramic. In particular, a Fe—Cr (iron-chromium) alloy, a Fe—Ni (iron-nickel) alloy, a Fe—Cr—Ni (iron-chromium-nickel) alloy, and the like are suitable.

The substrate may take the form of a thin film, a block, or a powder, as well as a flat plate. Among these, in particular, such a form that the substrate has a large surface area for its volume is advantageous to mass production.

(Carburizing Prevention Layer)

The substrate may have a carburizing prevention layer formed on either a front or back surface thereof. Of course, it is desirable that the substrate have a carburizing prevention layer formed on each of the front and back surfaces thereof. The carburizing prevention layer is a protecting layer for preventing the substrate from being carburized and therefore deformed in the step of generating the carbon nanotubes.

It is preferable that the carburizing prevention layer be composed of a metal or ceramic material, or especially preferably the ceramic material, which is highly effective in preventing carburizing. Examples of the metal include copper and aluminum. Examples of the ceramic material include: oxides such as aluminum oxide, silicon oxide, zirconium oxide, magnesium oxide, titanium oxide, silica alumina, chromium oxide, boron oxide, calcium oxide, and zinc oxide; and nitrides such as aluminum nitride and silicon nitride. Among them, aluminum oxide and silicon oxide are preferable because they are highly effective in preventing carburizing.

(Catalyst)

The substrate or the carburizing prevention layer has a catalyst supported thereon. Any type of catalysts that is usable for production of the CNTs can be used. Examples of the catalyst include iron, nickel, cobalt, molybdenum, a chloride thereof, an alloy thereof, and a complex or layer thereof with aluminum, alumina, titania, titanium nitride, or silicon oxide. Examples that can be given are an iron-molybdenum thin film, an alumina-iron thin film, an alumina-cobalt thin film, an alumina-iron-molybdenum thin film, an aluminum-iron thin film, and an aluminum-iron-molybdenum thin film. The catalyst can be used in a range of existential quantities that is usable for production of the CNTs. For example, in the case of use of iron, it is preferable that the thickness of a layer formed be not less than 0.1 nm but not greater than 100 nm, more preferably not less than 0.5 nm but not greater than 5 nm, or especially preferably not less than 0.8 nm but not greater than 2 nm.

It is possible to apply either a wet or dry process to the formation of the catalyst layer onto the surface of the substrate. Specifically, it is possible to apply a sputtering evaporation method or a method for spreading/calcining a liquid obtained by dispersing fine metal particles in an appropriate solvent. Further, it is possible to form the catalyst into any shape with concomitant use of patterning obtained by applying well-known photolithography, nanoinprinting, or the like.

A production method of the present invention makes it possible to arbitrarily control the shape of the aligned CNT aggregate, according to the catalyst patterning formed on a base substrate and the growth time for the CNTs, so that the aligned CNT aggregate takes a thin-film shape, a cylindrical shape, a prismatic shape, or any other complicated shape. In particular, in the shape of a thin film, the aligned CNT aggregate has an extremely small thickness (height) as compared with its length and width; however, the length and width can be arbitrarily controlled according to the catalyst patterning, and the thickness can be arbitrarily controlled according to the growth time for the CNTs that constitute the aligned CNT aggregate.

(Reducing Gas)

In general, a reducing gas is a gas that has at least one of the effects of reducing a catalyst, stimulating the catalyst to become fine particles suitable for the growth of the CNTs, and improving the activity of the catalyst, and that is in a gaseous state at a growth temperature. Any type of reducing gases that is usable for production of the CNTs can be used. A typically applicable example of the reducing gas is a gas having a reducing ability, such as hydrogen gas, ammonium, water vapor, or a mixture thereof. Alternatively, it is possible to apply a mixed gas obtained by mixing hydrogen gas with an inert gas such as helium gas, argon gas, or nitrogen gas. The reducing gas is generally used in a formation step, but may be used in a growth step as appropriate.

(Raw Material Gas)

As a raw material for use in generation of the CNTs in the present invention, any type of raw materials that is usable for production of the CNTs can be used. For example, gasses having raw-material carbon sources at the growth temperature can be used. Among them, hydrocarbons such as methane, ethane, ethylene, propane, butane, pentane, hexane, heptane, and acetylene are suitable. In addition, lower alcohols such as methanol and ethanol, acetone, oxygen-containing compounds having small numbers of carbon atom such as carbon monoxide, and mixtures thereof can be used. Further, the raw material gas may be diluted with an inert gas.

(Inert Gas)

The inert gas only needs to be a gas that is inert at the temperature at which the CNTs grow, and that does not react with the growing CNTs. Any type of inert gases that is usable for production of the CNTs can be used. Examples that can be given are helium, argon, nitrogen, neon, krypton, hydrogen, chlorine, and mixtures thereof. In particular, nitrogen, helium, argon, and mixtures thereof are suitable. Some raw material gases possibly react chemically with hydrogen. In this case, it is necessary to reduce the amount of hydrogen to be used but it is necessary that the reduction of the amount of hydrogen do not inhibit the growth of the CNTs. In the case of use of ethylene as the raw material gas, it is preferable that a hydrogen concentration be not more than 1%.

(Catalyst Activation Material)

It is possible to add a catalyst activation material in the CNT growth process. The addition of the catalyst activation material makes it possible to further improve an efficiency in the production of the carbon nanotubes, and a purity of the carbon nanotubes. In general, the catalyst activation material used here only needs to be an oxygen-containing substance that does no significant damage to the CNTs at the growth temperature. Effective examples other than water include: hydrogen sulfide; oxygen-containing compounds having small numbers of carbon atom such as oxygen, ozone, acidic gases, carbon monoxide, and carbon dioxide; alcohols such as ethanol and methanol; ethers such as tetrahydrofuran; ketones such as acetone; aldehydes; esters; nitrogen oxide; and mixtures thereof. Among them, water, oxygen, carbon dioxide, carbon monoxide, and ethers such as tetrahydrofuran are preferable. In particular, water is suitable.

The catalyst activation material is not particularly limited in amount to be added. However, the catalyst activation material only needs to be added in minute amounts. For example, when the catalyst activation material is water, the catalyst activation material only needs to be added in a range of not less than 10 ppm but not greater than 10,000 ppm, preferably not less than 50 ppm but not greater than 1,000 ppm, more preferably not less than 100 ppm but not greater than 700 ppm.

The mechanism by which the catalyst activation material functions is deduced at this stage as follows: In the process of growth of the CNTs, adhesion of by-products such as amorphous carbon and graphite to the catalyst causes deactivation of the catalyst, and the growth of the CNTs is therefore inhibited. However, the presence of the catalyst activation material causes amorphous carbon, graphite and the like to be oxidized into carbon monoxide, carbon dioxide and the like, and therefore gasified. Therefore, the catalyst activation material is believed to cleanse the catalyst and express the function (catalyst activation function) of enhancing the activity of the catalyst and extending an active life of the catalyst.

With the catalyst activation material thus added, the activity of the catalyst is enhanced and the life of the catalyst is extended. When the catalyst activation material is added, the growth of the CNTs, which would continue for approximately two minutes at longest if the catalyst activation material were not added, continues for several tens of minutes, and a growth rate of the CNTs increases by a factor of not less than 100 or, furthermore, a factor of 1,000. As a result, an aligned CNT aggregate with a marked increase in height is obtained.

(Environment of High-Carbon Concentration)

An environment of high-carbon concentration means a growth atmosphere in which the proportion of the raw material gas to the total flow is approximately 2% to 20%. According to a chemical vapor deposition method that does not involve the use of a catalyst activation material, an increase in carbon concentration causes fine catalyst particles to be covered with carbonaceous impurities generated in the process of synthesis of the CNTs; therefore, the catalyst is easily deactivated, and the CNTs cannot grow efficiently. For this reason, the CNTs are synthesized in a growth atmosphere (environment of low-carbon concentration) in which the proportion of the raw material gas to the total flow is approximately 0.1% to 1%.

Since the activity of the catalyst is remarkably improved in the presence of the catalyst activation material, the catalyst is not deactivated even in an environment of high-carbon concentration. Thus, long-term growth of the CNTs is made possible, and the growth rate of the CNTs is remarkably improved. However, in the environment of high-carbon concentration, a large amount of carbon contaminants adhere to a furnace wall and the like, as compared with an environment of low-carbon concentration.

(Furnace Pressure)

It is preferable that a furnace pressure be not lower than $10^2$ Pa but not higher than $10^7$ Pa (100 atm), or more preferably not lower than $10^4$ Pa but not higher than $3\times10^5$ Pa (3 atm).

(Reaction Temperature)

A reaction temperature at which the CNTs grow is appropriately determined in consideration of a metal catalyst, the raw-material carbon source, and a reaction pressure. In the case of inclusion of the step of adding the catalyst activation material in order to eliminate a by-product that serves as a factor of catalyst deactivation, it is desirable that the reaction temperature be set in such a temperature range that the catalyst activation material sufficiently expresses its effect. That is, the most desirable temperature range has a lower-limit temperature at or above which the catalyst activation material can remove by-products such as amorphous carbon and graphite and a higher-limit temperature at or below which the CNTs, which are main products, are not oxidized by the catalyst activation material.

Specifically, in the case where the catalyst activation material is water, it is preferable that the reaction temperature be not less than 400° C. but not more than 1000° C. At 400° C. or higher, the catalyst activation material sufficiently expresses its effect. At 1000° C. or lower, it is possible to prevent the catalyst activation material from reacting with the CNTs.

Alternatively, in the case where the catalyst activation material is carbon dioxide, it is preferable that the reaction temperature be not less than 400° C. but not more than 1100° C. At 400° C. or higher, the catalyst activation material sufficiently expresses its effect. At 1100° C. or lower, it is possible to prevent the catalyst activation material from reacting with the CNTs.

(Formation Step)

The formation step is a step of causing an environment surrounding the catalyst supported by the substrate to be an environment of the reducing gas and heating at least either the catalyst or the reducing gas. This step brings about at least one of the effects of reducing the catalyst, stimulating the catalyst to become fine particles suitable for the growth of the CNTs, and improving the activity of the catalyst. For example, when the catalyst is an alumina-iron thin film, the iron catalyst is reduced to become fine particles, whereby a large number of fine iron particles in nanometer size are formed on the alumina layer. Thus, the catalyst is prepared to be a catalyst suitable to production of the aligned CNT aggregate.

(Growth Step)

The growth step is a step of growing the aligned CNT aggregate by causing the catalyst, which in the formation step has been put in a state suitable to production of the aligned CNT aggregate, to be surrounded by a raw material gas environment constituted by a raw material gas and by heating at least either the catalyst or the raw material gas.

(Cooling Step)

A cooling step is a step of, after the growth step, cooling down the aligned CNT aggregate, the catalyst and the substrate in the presence of an inert gas. After the growth step, the aligned CNT aggregate, the catalyst and the substrate are high in temperature, and as such, are oxidized when placed in the presence of oxygen. This is prevented by cooling down the aligned CNT aggregate, the catalyst and the substrate to, for example, not more than 400° C., or more preferably not more than 200° C.

(Production Apparatus Part I)

A production apparatus used in the present invention essentially includes a synthesizing furnace that accommodates the substrate supporting the catalyst and heating means. Meanwhile, other mechanisms and configurations of sections other than the synthesizing furnace and the heating means of the production apparatus are not particularly limited. Examples of the production apparatus encompass conventionally well-known apparatuses such as a thermal CVD furnace, a thermally heating furnace, an electric furnace, a drying furnace, a constant temperature bath, an atmospheric furnace, a gas replacement furnace, a muffle furnace, an oven, a vacuum heating furnace, a plasma reactor, a microplasma reactor, an RF plasma reactor, an electromagnetic heating reactor, a microwave reactor, an infrared heating furnace, an ultraviolet heating reactor, an MBE reactor, an MOCVD reactor, and a laser heater.

FIG. 1 shows, as an example, a production apparatus used in the present invention. The production apparatus includes a tubular synthesizing furnace 304 that accommodates a substrate 301 supporting a catalyst, and a heater 305 provided around the synthesizing furnace 304. The heater preferably heats at not less than 400° C. but not more than 1100° C. Examples of the heater encompass a resistance heater, an infrared heater and an electromagnetic induction heater.

A substrate holder 302 for holding the substrate 301 thereon is provided in a lower part of the synthesizing furnace 304, and a gas ejection section 303 is provided above the substrate holder 302. The gas ejection section 303 ejects the reducing gas, the raw material gas, the inert gas, the catalyst activation material and the like to the substrate. A non-return valve, a flow control valve, a flow sensor and the like (not shown) are provided in a part through which gases flow toward the gas ejection section 303. Opening and closing of the flow control valve are controlled as appropriate by a control device. This makes it possible to control flow volume of the reducing gas, the raw material gas, the invert gas, the catalyst activation material and the like. A mixture of these gases is ejected from the gas ejection section 303. The gas ejected from the gas ejection section 303 is naturally discharged outside the synthesizing furnace from an outlet.

The aligned CNT aggregate is produced as follows: Firstly, the substrate 301 supporting the catalyst thereon is placed on the substrate holder 302 in the synthesizing furnace 304. Thereafter, the inert gas is ejected from the gas ejection section 303 whereby air in the synthesizing furnace 304 is replaced by the inert gas. Subsequently, in a formation step, the reducing gas is ejected from the gas ejection section 303 while the synthesizing furnace 304 is heated by the heater 305. Subsequently, in a growth step, the raw material gas and the catalyst activation material are ejected from the gas ejection section 303 while the synthesizing furnace 304 is further heated by the heater 305. In this manner, the aligned CNT aggregate is produced on the substrate 301. Lastly, in a cooling step, the inert gas is ejected from the gas ejection section 303, and the heater 305 stops heating the synthesizing furnace 304. The synthesizing furnace 304 is cooled down to not more than 200° C.

Means for supplying the catalyst activation material is not particularly limited. Examples of the means include supplying the catalyst activation material by use of a bubbler, supplying the catalyst activation material by vaporizing a solution containing a catalyst activation agent, supplying the catalyst activation material as it is in a gaseous state, and supplying the catalyst activation material by liquefying or vaporizing a solid catalyst activation agent. It is possible to build a supply system using various devices such as a vaporizer, a mixer, a stirrer, a diluter, a spray, a pump, and a compressor, so as to supply the catalyst activation material. Further, a measurement device for measuring a concentration of the catalyst activation material may be provided in a supply tube or the like for supplying the catalyst activation material. A feedback control is carried out on the basis of an output obtained by the measurement device. Through feedback control using values outputted from the measuring device, stable supply of the catalyst activation material with a small number of changes over time can be ensured.

The gas ejection section 303 is not particularly limited. A shower head having a plurality of nozzles formed so as to face a catalyst layer formation surface of the substrate can be used as the gas ejection section 303. What is meant by "so as to face" is that the nozzles are formed such that an angle made by ejection axis lines of the nozzles and a normal line of the substrate ranges from not less than 0° to less than 90°. That is, gas flow ejected from the nozzles provided in the shower head directs substantially orthogonally to the substrate.

Ejecting the reducing gas by use of such a shower head makes it possible to evenly scatter the reducing gas over the substrate thereby causing an efficient reducing of the catalyst. This leads to evenly growing the aligned CNT aggregate on the substrate and a decrease in consumption quantity of the reducing gas.

Further, ejecting the raw material gas by use of such a shower head makes it possible to evenly scatter the raw material gas over the substrate thereby causing an efficient consumption of the raw material gas. This leads to evenly growing the aligned CNT aggregate on the substrate and a decrease in consumption quantity of the raw material gas.

Furthermore, ejecting the catalyst activation material by use of such a shower head makes it possible to evenly scatter the catalyst activation material over the substrate thereby causing an increase in the activity of the catalyst and extension of the life of the catalyst. This allows the aligned CNT aggregate to grow for a long time period.

(Production Apparatus Part II)

FIG. 2 shows an aligned CNT aggregate production apparatus in accordance with the present invention. The production apparatus of present invention basically includes an inlet purge section, a formation unit, a growth unit, a transfer unit, gas mixing prevention means, connection sections, a cooling unit, and an outlet purge section. The following describes how these are arranged in the production apparatus.

(Inlet Purge Section)

The inlet purge section is a set of devices for preventing the outside air from flowing into a furnace of the apparatus through a substrate inlet, and has a function of replacing with a purge gas an environment surrounding the substrate transferred into the apparatus. Examples of the inlet purge section include a furnace or chamber in which the purge gas is retained, and a gas ejection section for ejecting the purge gas. It is preferable that the purge gas be an inert gas. In particular, in terms of safety, cost, purging properties and the like, it is preferable that the purge gas be nitrogen. When the substrate inlet is always open as in the case where the transfer unit is a belt-conveyor type, it is preferable to use, as a purge gas ejection section, a gas curtain device that ejects the purge gas from top and bottom in the form of a shower, in order to prevent the outside air from flowing in through an inlet of the apparatus.

(Formation Unit)

The formation unit is a set of devices for carrying out a formation step, and has a function of causing the catalyst formed on the surface of the substrate to be surrounded by the reducing gas environment constituted by the reducing gas, and heating at least either the catalyst or the reducing gas. Specific examples of the formation unit include a formation furnace in which the reducing gas is retained, a reducing gas ejection section for ejecting the reducing gas, and a heater for heating at least either the catalyst or the reducing gas. It is preferable that the heater be capable of heating to a temperature of 400° C. to 1100° C. Examples of the heater include a resistance heater, an infrared heater, and an electromagnetic induction heater.

(Growth Unit)

The growth unit is a set of devices for carrying out a growth step, and has a function of synthesizing the aligned CNT aggregate by causing the catalyst, which has been put into a state suitable to production of the aligned CNT aggregate in the formation step, to be surrounded by the raw material environment constituted by the raw material gas, and by heating at least either the catalyst or the raw material gas. Specific examples of the growth unit include a growth furnace in which the environment of the raw material gas is retained, a raw material gas ejection section for ejecting the raw material gas, and a heater for heating at least either the catalyst or the raw material gas. The heater may be any heaters that are capable of heating at a temperature of 400° C. to 1,100° C., examples of which include a resistance heater, an infrared heater, and an electromagnetic induction heater. It is preferable that the growth unit further include a section for adding the catalyst activation material.

(Section for Adding the Catalyst Activation Material)

The section for adding the catalyst activation material is a set of devices for either adding the catalyst activation material into the raw material gas, or adding the catalyst activation material directly to the environment surrounding the catalyst in the growth furnace. Means for supplying the catalyst activation material is not particularly limited. Examples of the means include supplying the catalyst activation material through a bubbler, supplying the catalyst activation material by vaporizing a solution containing a catalyst activation agent, supplying the catalyst activation material as it is in a gaseous state, and supplying the catalyst activation material by liquefying or vaporizing a solid catalyst activation agent. It is possible to build a supply system using various apparatuses such as a vaporizer, a mixer, a stirrer, a diluter, a spray, a pump, and a compressor. Furthermore, it is possible to provide a tube or the like for the supply of the catalyst activation material with a device for measuring a concentration of the catalyst activation material. Through feedback control using values outputted from the measuring device, stable supply of the catalyst activation material with a small number of changes over time can be ensured.

(Transfer Unit)

The transfer unit is a set of devices necessary for transferring the substrate at least from the formation unit to the growth unit. An example of the transfer unit is a mesh belt and a drive device driven by a reducer-equipped electric motor in the case of a belt-conveyor type.

(Gas Mixing Prevention Means)

The gas mixing prevention means is a set of devices that is installed at the connection sections, via which the respective inner parts of the units are spatially connected, and that performs a function of preventing gas from flowing out of a furnace space of one of the units into that of another. Examples of the gas mixing prevention means include a gate valve device that mechanically disconnects the spatial connection between one unit and another except when the substrate moves from one unit to another, a gas curtain device that disconnects the spatial connection by ejecting an inert gas, and an exhaust device through which gasses in the connection sections and/or those areas in the units which are near the connection sections are exhausted out of the system. In order to surely prevent gas mixing, it is preferable that a shutter and/or a gas curtain be used in combination with the exhaust device. Further, in order to transfer the substrate from one unit to another without interruption from the point of view of efficient continuous growth, and from the point of view of simplification of mechanism, it is more preferable that the exhaust device be used alone. The gas mixing prevention means needs to function such that a concentration of carbon atoms in the environment of the reducing gas in the formation furnace is kept preferably smaller than or equal to $5 \times 10^{22}$ atoms/m$^3$, or more preferably smaller than or equal to $1 \times 10^{22}$ atoms/m$^3$.

When the exhaust device is used to prevent gas mixing, each exhaust quantity Q of a plurality of exhaust sections cannot be independently determined, and need to be adjusted according to the amount of gas supplied to the whole apparatus (e.g., the flow rate of the reducing gas, the flow rate of the raw material gas, and the flow rate of a coolant gas). Note that a necessary condition for gas mixing prevention to be satisfied can be represented by the following equation:

$$Q \geq 4DS/L$$

where D is a diffusion coefficient of a gas that needs to be prevented from flowing in, S is a sectional area of a boundary at which the gas is prevented from flowing in, and L is a length of each exhaust section (along a length of the furnace). The exhaust quantity of each exhaust section is set such that the conditional equation is satisfied and a balance between gas supply and gas exhaust in the whole apparatus is kept.

(Concentration of Carbon Atoms)

Inflow of the raw material gas into the formation furnace exerts a harmful influence on the growth of the CNTs. It is preferable that the inflow of the raw material gas into the formation furnace be prevented by the gas mixing prevention means so that the concentration of carbon atoms in the environment of the reducing gas in the formation unit is kept preferably smaller than or equal to $5 \times 10^{22}$ atoms/m$^3$, or more preferably smaller than or equal to $1 \times 10^{22}$ atoms/m$^3$. The "concentration of carbon atoms" here is calculated according to Eq. (1):

[Eq. (1)]

$$\text{(Concentration of Carbon Atoms)} = \sum_i C_i \frac{\rho_i D_i}{M_i} N_A \quad (1)$$

where with respect to the types of gas contained in the reducing gas (i=1, 2, . . . ), the concentration (ppmv) is denoted by $D_1$, $D_2$, . . . , the density in standard condition (g/m$^3$) is denoted by $\rho_1$, $\rho_2$, . . . , the molecular weight is denoted by $M_1$, $M_2$, . . . , and the number of carbon atoms contained in each gas molecule is denoted by $C_1$, $C_2$, . . . , and the Avogadro's number is denoted by NA.

Production quantity and quality of the CNTs can be satisfactorily maintained by keeping the concentration of carbon atoms in the environment of the reducing gas in the formation furnace at not greater than $5 \times 10^{22}$ atoms/m$^3$. That is, the concentration of carbon atoms of $5 \times 10^{22}$ atoms/m$^3$ or smaller makes it possible, in the formation step, to satisfactorily exhibit the effects of reducing the catalyst, stimulating the catalyst to become fine particles suitable for the growth of the CNTs, and improving the activity of the catalyst, whereby the production quantity and quality of the CNTs during the growth step can be satisfactorily improved.

(Connection Sections)

The connection sections are a set of devices via which the respective furnace spaces of the units are spatially connected and which serve to prevent the substrate from being exposed to the outside air when it is transferred from one unit to another. Examples of the connection sections include a furnace or chamber capable of shielding the environment surrounding the substrate from the outside air and passing the substrate from one unit to another.

(Cooling Unit)

The cooling unit is a set of devices necessary for cooling down the substrate on which the aligned CNT aggregate has grown. The cooling unit has a function of preventing oxidation and cooling effects on the aligned CNT aggregate, the catalyst and the substrate after the growth step. Examples of the cooling unit include: a cooling furnace in which an inert gas is retained; a water-cooled cooling tube disposed to surround an internal space of the cooling furnace in the case of a water-cooled type; and an ejection section that ejects an inert gas into the cooling furnace in the case of an air-cooled type. Further, the water-cooled type and the air-cooled type may be used in combination.

(Outlet Purge Section)

The outlet purge section is a set of devices for preventing the outside air from flowing into a furnace of the apparatus through a substrate outlet. The outlet purge section has a function of causing the environment surrounding the substrate to be an environment of a purge gas. Specific examples of the outlet purge section include a furnace or chamber in which the environment of the purge gas is retained, and an ejection section for ejecting the purge gas. It is preferable that the purge gas be an inert gas. In particular, in terms of safety, cost and purging properties, it is preferable that the purge gas be nitrogen. When the substrate outlet is always open as in the case where the transfer unit is a belt-conveyor type, it is preferable to use, as a purge gas ejection section, a gas curtain device that ejects the purge gas from top and bottom in the form of a shower, in order to prevent the outside air from flowing in through an outlet of the apparatus.

(Reducing Gas Ejection Section, Raw Material Gas Ejection Section, and Catalyst Activation Material Ejection Section)

As the reducing gas ejection section, the raw material gas ejection section, and the catalyst activation material ejection section, shower heads each including a plurality of nozzles provided so as to face the catalyst layer formation surface of the substrate may be used. What is meant by "so as to face" is that each of the nozzles is provided such that its ejection axis line forms an angle of not less than 0° to less than 90° with a line normal to the surface of the substrate, i.e., such that the flow direction of gas as ejected from the nozzles provided in the shower head is substantially orthogonal to the surface of the substrate.

Use of such a shower head as the reducing gas ejection section makes it possible to spray the reducing gas uniformly onto the substrate and therefore efficiently reduce the catalyst. This makes it possible, as a result, to enhance a uniformity of the aligned CNT aggregate that grows on the substrate, and lower the consumption of the reducing gas.

Use of such a shower head as the raw material gas ejection section makes it possible to spray the raw material gas uniformly onto the substrate and therefore efficiently consume the raw material gas. This makes it possible, as a result, to enhance the uniformity of the aligned CNT aggregate that grows on the substrate and lower the consumption of the raw material gas.

Use of such a shower head as the catalyst activation material ejection section makes it possible to spray the catalyst activation material uniformly onto the substrate and therefore enhance the activity of the catalyst and extend the life of the catalyst. This allows the aligned CNTs to continue to grow over a long period of time. The same is true in a case where the catalyst activation material is added to the raw material gas and a shower head is used as an ejection section for the mixture.

As shown in FIG. 2, a formation unit 102, a growth unit 104 and a cooling unit 105 include a formation furnace 102a, a growth furnace 104a and a cooling furnace 105a, respectively. A transfer unit 107 includes a mesh belt 107a and a belt driving section 107b. These furnaces are spatially connected to one another via connection sections. The transfer unit 107 transfers a substrate (catalyst substrate) 111 into the formation furnace, the growth furnace and the cooling furnace in this order.

First, provided at an inlet of the apparatus is an inlet purge section 101, which ejects the purge gas from top and bottom in the form of a shower thereby preventing the outside air from flowing into the furnace of the apparatus through the inlet.

The inlet purge section 101 and the formation unit 102 are spatially connected to each other via the connection section in which an exhaust section 103a of the gas mixing prevention means is disposed, and through the exhaust section 103a, a mixture of the purge gas ejected from the inlet purge section 101 and the reducing gas ejected from a reducing gas ejection section 102b is discharged. The exhaust section 103a prevents the purge gas from flowing into the formation furnace and the reducing gas from flowing into the inlet purge section.

The formation unit 102 and the growth unit 104 are spatially connected to each other via the connection section in which an exhaust section 103b of the gas mixing prevention means is disposed, and through the exhaust section 103b, a mixture of the reducing gas inside of the formation furnace and the raw material gas inside of the growth furnace is discharged. The exhaust section 103b prevents the raw material gas from flowing into the formation furnace and the reducing gas from flowing into the growth furnace.

The growth unit 104 and the cooling unit 105 are spatially connected to each other via the connection section in which an exhaust section 103c of the gas mixing prevention means is disposed, and through the exhaust section 103c, a mixture of the raw material gas inside of the growth furnace and the inert gas inside of the cooling furnace is discharged. The exhaust section 103c prevents the raw material gas from flowing into the cooling furnace and the inert gas from flowing into the growth furnace.

Provided at an outlet of the apparatus is an outlet purge section 106 substantially identical in structure to the inlet purge section 101. The outlet purge section 106 ejects the purge gas from top and bottom in the form of a shower thereby preventing the outside air from flowing into the cooling furnace through the outlet.

The transfer unit 107 is of a belt-conveyor type in which the substrate on which surface the catalyst is formed is transferred out of the formation furnace into the cooling furnace through the growth furnace by the mesh belt 107a driven by the belt driving section (driving device) 107b, for example, with use of a reducer-equipped electric motor. Moreover, the formation furnace and the growth furnace have their respective internal spaces spatially connected via the connection section, and the growth furnace and the cooling furnace have their respective internal spaces spatially connected via the connection section, in order that the mesh belt 107a, on which the substrate has been placed, can pass out of the formation furnace into the cooling furnace through the growth furnace. At these boundaries, the exhaust sections of the gas mixing prevention means described above are provided, so as to prevent gas from flowing out of one of the furnaces into another.

As described above, in the CNT production apparatus according to the present invention, a series of substrates each having the catalyst on a surface thereof is transferred by the transfer unit 107 to pass through the inlet purge section 101, the formation unit 102, the growth unit 104, the cooling unit 105, and the outlet purge section in this order. In the meantime, the catalyst is reduced in the environment of the reducing gas in the formation unit 102, and the CNTs grow on the surfaces of the substrates in the environment of the raw material gas in the growth unit 104, and then the CNTs are cooled down in the cooling unit 105.

(Materials for Components of the Apparatus Which Are Exposed to Either the Reducing Gas or the Raw Material Gas)

Components of the synthesizing furnace, the substrate holder, the gas ejection sections and the like of the production apparatus part I, and components of the formation furnace, the reducing gas ejection section, the growth furnace, the raw material ejection section, the mesh belt, the exhaust sections of the gas mixing prevention means, and furnaces of the connection sections of the production apparatus part II are exposed to the reducing gas or the raw material gas. A material for those components of the production apparatuses is preferably heat-resistant alloys in terms of heat resistance, precision of processing, degree of flexibility of processing and cost. Examples of the heat-resistant alloys include heat-resistant steel, stainless steel, and nickel-based alloys. In general, a heat-resistant steel refers to a steel that contains Fe in major proportions and other alloys in concentrations of not greater than 50%, and a stainless steel refers to a steel that contains Fe in major proportions, other alloys in concentrations of not greater than 50%, and approximately not less than 12% of Cr. Further, examples of the nickel-based alloys include alloys obtained by adding Mo, Cr, Fe, and the like to Ni. Specifically, SUS 310, Inconel 600, Inconel 601, Inconel 625, Incoloy 800, MC Alloy, and Haynes 230 Alloy are preferable in terms of heat resistance, mechanical strength, chemical stability, low cost and the like.

Carbon contaminants that adhere to the wall surfaces and the like when the CNTs are synthesized in a high-carbon environment can be decreased by forming the inner walls of the furnaces and/or the components for use in the furnaces with a heat-resistant alloy and by either plating a surface of the heat-resistant alloy with molten aluminum or polishing the surface such that the surface has an arithmetic average roughness Ra≤2 μm. This favorably makes it possible to prevent a decrease in production quantity and deterioration in quality of the aligned CNT aggregates.

(Molten Aluminum Plating)

Molten aluminum plating means a process of forming an aluminum or aluminum alloy layer on a surface of an object by dipping the object into a bath of molten aluminum. More specifically, the process is carried out as follows: a surface of an object (base metal) is washed (preprocessed), and then the object is dipped into a bath of molten aluminum at approximately 700° C., thereby causing the molten aluminum to disperse into the surface of the base metal so as to form an alloy of the base metal and aluminum, so that the aluminum is adhered to the alloy layer when the base metal is withdrawn from the bath. Furthermore, the molten aluminum plating also encompasses a post-dipping process in which a Fe—Al alloy layer under the surface layer (the alumina layer and aluminum surface layer) is exposed by subjecting the surface layer to low-temperature thermal diffusion.

(Polishing)

Examples of the method for polishing the heat-resistant alloy such that an arithmetic average roughness of the heat-resistant alloy is Ra≤2 μm include: mechanical polishing, which is typified by buffing; chemical polishing, which involves the use of a chemical; electrolytic polishing, which is carried out while passing an electric current through an electrolyte; and complex electrolytic polishing, which is a combination of mechanical polishing and electrolytic polishing.

(Arithmetic Average Roughness)

For a definition of arithmetic average roughness Ra, see "JIS B 0610: 2001".

The present invention is not limited to the description of the preferred embodiments above, but may be applied in many variations within the scope of gist thereof.

For example, through an appropriate setting of reaction conditions such as raw material gas and heating temperature, it is possible to selectively produce either single-walled or multiwall CNTs in the production apparatus, and it is also possible to produce both single-walled and multiwall CNTs.

Further, although in the production apparatus part II of the present embodiment, the catalyst is formed onto the surface of the substrate by a film-forming apparatus provided separately from the production apparatus, the production apparatus may be configured such that a catalyst layer-forming unit is provided upstream of the formation unit so that a base substrate passes through the catalyst layer-forming unit before it passes through the formation unit.

Further, although in the production apparatus part II of the present embodiment, the formation, growth and cooling units are arranged in this order and have their respective furnace spaces spatially connected via the connection sections, a plurality of units that process steps other than the formation, growth and cooling steps may be further provided somewhere and have their respective furnace spaces spatially connected via connection sections.

Further, although in the production apparatus part II of the present embodiment, the belt-conveyor type has been described as a type of transfer unit, the present invention is not limited to this. For example, a robot-arm type, a turntable type or a lifting-and-lowering type may be employed.

Further, although in the production apparatus part II of the present embodiment, two types of arrangement of the formation, growth and cooling units, namely linear arrangement and circular arrangement have been described, the present invention is not limited to these types. For example, these units may be arranged vertically in this order.

EXAMPLE

Examples are given below to explain the present invention in detail. However, the present invention is not limited to these Examples. Evaluation in accordance with the present invention was carried out in the following manner.

(Measurement of Specific Surface Area)

The term "specific surface area" means a value obtained from an adsorption and desorption isotherm of liquid nitrogen at 77K using the Brunauer-Emmett-Teller equation. The specific surface area was measured by use of a BET specific surface area measuring apparatus (HM model-1210; manufactured by MOUNTECH Co., Ltd.).

(G/D Ratio)

The term "G/D ratio" means an index that is commonly used to evaluate the quality of CNTs. In a raman spectrum of CNTs as measured by a raman spectroscopic instrument, vibration modes called "G band" (near 1,600 $cm^{-1}$) and "D band" (near 1,350 $cm^{-1}$) are observed. The G band is a vibration mode based on hexagonal lattice structures of graphite appearing as cylindrical surfaces of the CNTs, and the D band is a vibration mode based on crystal defects. Therefore, with a higher peak intensity ratio of the G band to the D band (G/D ratio), the CNTs can be evaluated to be higher in quality and lower in defect rate.

In the present example, the G/D ratio was calculated by peeling off a part of an aligned CNT aggregate located near the center of a substrate and measuring a raman spectrum through irradiation with a laser of that surface of the aligned CNT aggregate which had been peeled off from the substrate, by use of a microscopic laser raman system (Nicolet Almega XR; manufactured by Thermo Fisher Scientific K.K.).

(Surface Roughness)

A surface roughness of the present invention is an arithmetic average roughness Ra. The value of Ra was calculated under the following measurement condition by use of a laser microscope (VK-9710 manufactured by KEYENCE CORPORATION).

<Measurement Condition>

Measurement mode: surface shape
Measurement quality: high resolution
Objective lens: CF IC EPI Plan 10×
Measuring range: 1.42 $mm^2$ (1.42 mm×1.0 mm)
Measurement pitch in Z direction: 0.1 μm
Analysis software (VK-shaped analysis application VK-H1A1 manufactured by KEYENCE CORPORATION) has a function of measuring "surface roughness". Ra was calculated on the basis of height data calculated by the analysis software.

Example 1

A specific example is given below to describe in detail an apparatus according to the present invention for producing aligned CNT aggregates.

The following describes conditions for production of a substrate supporting a catalyst. A base substrate used was Fe—Ni—Cr alloy YEF 426 (Ni 42%, Cr 6%; manufactured by Hitachi Metals, Ltd.) having a size of 40 mm×40 mm with a thickness of 0.3 mm. A surface roughness of the base substrate was measured by use of a laser microscope, and it was found that an arithmetic average roughness of the base substrate was Ra≈2.1 μm. Alumina layers with a thickness of 100 nm were formed on both front and back surfaces of the base substrate by use of a sputtering apparatus. Then, an iron layer (catalyst metal layer) with a thickness of 1.0 nm was formed only on the front surface of the base substrate by use of the sputtering apparatus.

FIG. 1 shows a production apparatus of the present example. The substrate supporting the catalyst thereon was placed on a substrate holder in a synthesizing furnace adjusted to have a room temperature and a furnace pressure of 1.02E+5. Thereafter, 4000 sccm of nitrogen was introduced into the synthesizing furnace from a gas ejection section for 4 minutes, so that air in the synthesizing furnace was replaced by nitrogen. Thereafter, 400 sccm of nitrogen and 3600 sccm of hydrogen were introduced into the synthesizing furnace from the gas ejection section for 30 minutes while the synthesizing furnace was heated up to 800° C. at a heating-up rate of 26° C./minute (formation step).

Thereafter, a mixed gas of 880 sccm of nitrogen, 100 sccm of ethylene, and 20 sccm of water-containing nitrogen (moisture content 12,000 ppmv) was ejected from the gas ejection section for 10 minutes into the synthesizing furnace adjusted to constantly have a temperature of 800° C. and the furnace pressure of 1.02E+5 (growth process). After the growth step, 4000 sccm of nitrogen was introduced into the synthesizing furnace from the gas ejection section while the synthesizing furnace was naturally cooled down to not more than 200° C. (cooling step).

The synthesizing furnace, the substrate holder and the gas ejection section were made from SUS310S, and surfaces thereof were plated with molten aluminum. The surfaces had an arithmetic average roughness Ra of 3.4 μm to 8.0 μm (the surface roughness was measured within 236 μm in z direction).

Specifically, the surfaces were plated with molten aluminum as follows:

1. Washing and drying a surface of an object to be plated;
2. Soaking the object in a bath of molten aluminum adjusted to approximately 710° C. for 10 minutes to 30 minutes;
3. Air-cooling down the object to a normal temperature;
4. Washing the object with 12% of dilute hydrochloric acid, washing the object with water, and then drying the object; and
5. Heating the object at not more than 900° C. in the air.

An aligned CNT aggregate was continuously produced under the above-described conditions. Although properties of the aligned CNT aggregate that is produced according to the present example depends on the details of production conditions, the aligned CNT aggregate typically had a density of 0.03 g/cm$^3$, a BET-specific surface area of 1,100 m$^2$/g, an average external diameter of 2.9 nm, a half width of 2 nm, a carbon purity of 99.9%, and a Herman's orientation factor of 0.7. Table 1 shows results of production quantity, specific surface area and G/D ratio of the continuously produced aligned CNT aggregates.

TABLE 1

Measurement result of production quantity, specific surface area and G/D ratio of CNTs produced in Example 1

| | Number of times of production | | |
|---|---|---|---|
| | 1 | 25 | 50 |
| Production quantity (mg/cm$^2$) | 1.8 | 1.7 | 1.8 |
| G/D ratio | 6.6 | 6.7 | 6.5 |
| Specific surface area (m$^2$/g) | 1155 | 1178 | 1146 |

Example 2

The following describes conditions for producing a catalyst substrate. A base substrate used was Fe—Ni—Cr alloy YEF 426 (Ni 42%, Cr 6%; manufactured by Hitachi Metals, Ltd.) having a size of 90 mm×90 mm with a thickness of 0.3 mm. A surface roughness of the base substrate was measured by use of the laser microscope, and it was found that an arithmetic average roughness of the base substrate was Ra≈2.1 μm. Alumina layers with a thickness of 20 nm were formed on both front and back surfaces of the base substrate by use of the sputtering apparatus. Then, an iron layer (catalyst metal layer) with a thickness of 1.0 nm was formed only on the front surface of the base substrate by use of the sputtering apparatus.

FIG. 2 shows a production apparatus of the present example. The production apparatus included an inlet purge section 101, a formation unit 102, gas mixing prevention means 103, a growth unit 104, a cooling unit 105, an outlet purge section 106, a transfer unit 107, and connection sections 108 to 110.

The catalyst substrate thus prepared was placed on a mesh belt in the production apparatus, and transferred at various transfer rates by the mesh belt to be subjected to the formation, growth, and cooling steps in this order, whereby the aligned CNT aggregates were produced.

Conditions for the inlet purge section, formation unit, gas mixing prevention means, growth unit, cooling unit, outlet purge section of the production apparatus were set as follows:

Inlet purge section 101

Purge gas: nitrogen 60,000 sccm

Formation unit 102

Furnace temperature: 830° C.

Reducing gas: nitrogen 11,200 sccm, hydrogen 16,800 sccm

Processing time: 28 minutes

Gas mixing prevention means 103

Exhaust quantity of exhaust section 103a: 20 sLm

Exhaust quantity of exhaust section 103b: 25 sLm

Exhaust quantity of exhaust section 103c: 20 sLm

Growth unit 104

Furnace temperature: 830° C.

Raw material gas: nitrogen 16,040 sccm, ethylene 1,800 sccm, water-vapor-containing nitrogen 160 sccm (moisture content 16,000 ppmv)

Processing time: 11 minutes

Cooling unit 105

Cooling water temperature: 30° C.

Inert gas: nitrogen 10,000 sccm

Cooling time: 30 minutes

Outlet purge section 106

Purge gas: nitrogen 50,000 sccm

Furnaces and ejection sections of the formation and growth units, the exhaust sections of the gas mixing prevention means, the mesh belt, the connection sections were made from SUS310, and surfaces thereof were plated with molten aluminum. The surfaces had an arithmetic average roughness Ra of 3.4 μm to 8.0 μm (the surface roughness was measured within 316 μm in z direction). Plating the surfaces with molten aluminum was carried out in the same manner as in Example 1.

Continuous production was carried out under the above-described conditions. Although properties of an aligned CNT aggregate that is produced according to the present example depends on the details of production conditions, the aligned CNT aggregate typically had a density of 0.03 g/cm$^3$, a BET-specific surface area of 1,100 m$^2$/g, an average external diameter of 2.9 nm, a half width of 2 nm, a carbon purity of 99.9%, and a Herman's orientation factor of 0.7. Table 2 shows results of production quantity, specific surface area and G/D ratio of the continuously produced aligned CNT aggregates.

TABLE 2

Measurement result of production quantity, specific surface area and G/D ratio of CNTs produced in Example 2

|  | Number of times of production | | |
| --- | --- | --- | --- |
|  | 1 | 150 | 300 |
| Production quantity (mg/cm$^2$) | 1.7 | 1.9 | 1.8 |
| G/D ratio | 8.1 | 7.5 | 7.2 |
| Specific surface area (m$^2$/g) | 1057 | 1100 | 1090 |

Further, during the continuous production, the reducing gas was sampled through a gas sampling port installed near the reducing gas ejection section, and the constitution of the sample was analyzed by an FTIR analyzer (Nicolet 6700 FT-IR; manufactured by Thermo Fisher Scientific K.K.). As a result, it was confirmed that the concentration of ethylene in the formation furnace was kept at 50 ppm by the gas mixing prevention means. This concentration is translated into a concentration of carbon atoms of approximately 3×10$^{21}$ atoms/m$^3$.

Example 3

The conditions for producing a substrate supporting a catalyst is identical to those in Example 1. Further, the production device and the production conditions of the present example are identical to those in Example 1 except materials of the synthesizing furnace, the substrate holder and the gas ejection section, and surface treatment thereof. The synthesizing furnace, the substrate holder and the gas ejection section of the present example were made from Inconel 601, and surfaces thereof were sandblasted, and polished by a sand paper or a polishing agent so as to have an arithmetic average roughness Ra of 1.4 µm to 1.9 µm (the surface roughness was measured within 293 µm in z direction).

An aligned CNT aggregate was continuously produced under the above conditions. Although properties of the aligned CNT aggregate that is produced according to the present example depends on the details of production conditions, a typical aligned CNT aggregate had a density of 0.03 g/cm$^3$, a BET-specific surface area of 1,100 m$^2$/g, an average external diameter of 2.9 nm, a half width of 2 nm, a carbon purity of 99.9%, and a Herman's orientation factor of 0.7. Table 3 shows results of production quantity, specific surface area and G/D ratio of the continuously produced aligned CNT aggregates.

TABLE 3

Measurement result of production quantity, specific surface area and G/D ratio of CNTs produced in Example 3

|  | Number of times of production | | |
| --- | --- | --- | --- |
|  | 1 | 25 | 50 |
| Production quantity (mg/cm$^2$) | 1.6 | 1.9 | 1.8 |
| G/D ratio | 6.1 | 5.5 | 6.2 |
| Specific surface area (m$^2$/g) | 1140 | 1118 | 1129 |

Example 4

The conditions for producing a substrate supporting a catalyst is identical to those in Example 2. Further, the production device and the production conditions of the present example are identical to those in Example 2 except materials of the furnaces and the ejection sections of the formation and growth units, the exhaust sections of the gas mixing prevention means, the mesh belt and the connection sections, and surface treatment thereof. The furnaces and the ejection sections of the formation and growth units, the exhaust sections of the gas mixing prevention means, the mesh belt, and the connection sections of the present example were made from Inconel 601, and surfaces thereof were sandblasted, and polished by a sand paper or a polishing agent so as to have an arithmetic average roughness Ra of 1.4 µm to 1.9 µm (the surface roughness was measured within 293 µm in z direction).

An aligned CNT aggregate was continuously produced under the above conditions. Although properties of the aligned CNT aggregate that is produced according to the present example depends on the details of production conditions, a typical aligned CNT aggregate had a density of 0.03 g/cm$^3$, a BET-specific surface area of 1,100 m$^2$/g, an average external diameter of 2.9 nm, a half width of 2 nm, a carbon purity of 99.9%, and a Herman's orientation factor of 0.7. Table 4 shows results of production quantity, specific surface area and G/D ratio of the continuously produced aligned CNT aggregates.

TABLE 4

Measurement result of production quantity, specific surface area and G/D ratio of CNTs produced in Example 4

|  | Number of times of production | | |
| --- | --- | --- | --- |
|  | 1 | 150 | 300 |
| Production quantity (mg/cm$^2$) | 1.8 | 1.9 | 1.8 |
| G/D ratio | 7.5 | 6.5 | 6.6 |
| Specific surface area (m$^2$/g) | 1070 | 1150 | 1090 |

Further, during the continuous production, the reducing gas was sampled through a gas sampling port installed near the reducing gas ejection section, and the constitution of the sample was analyzed by an FTIR analyzer (Nicolet 6700 FT-IR; manufactured by Thermo Fisher Scientific K.K.). As a result, it was confirmed that the concentration of ethylene in the formation furnace was kept at 50 ppm by the gas mixing prevention means. This concentration is translated into a concentration of carbon atoms of approximately 3×10$^{21}$ atoms/m$^3$.

Comparative Example

The conditions for producing a substrate supporting a catalyst is identical to those in Example 1. Further, the production device and the production conditions of the present comparative example are identical to those in Example 1 except materials of the synthesizing furnace, the substrate holder and the gas ejection section, and surface treatment thereof. The synthesizing furnace, the substrate holder and the gas ejection section of the present comparative example were made from Inconel 601, and surfaces thereof were sandblasted so as to have an arithmetic average roughness Ra of 3.2 µm to 4.1 µm (the surface roughness was measured within 364 µm in z direction).

An aligned CNT aggregate was continuously produced under the above conditions. Table 5 shows results of production quantity, specific surface area and G/D ratio of the continuously produced aligned CNT aggregates.

TABLE 5

Measurement result of production quantity, specific surface area and G/D ratio of CNTs produced in Comparative Example

| | Number of times of production | | |
|---|---|---|---|
| | 1 | 10 | 20 |
| Production quantity (mg/cm²) | 1.7 | 1.9 | 1.0 |
| G/D ratio | 6.3 | 6.5 | 2.8 |
| Specific surface area (m²/g) | 1020 | 980 | 846 |

As is clear from a comparison of the experimental results of Examples 1, 2, 3 and 4 with the experimental result of Comparative Example of the present invention, the production quantity, the specific surface area and the G/D ratio of the produced aligned CNT aggregates stably show great values regardless of the number of time of production.

The apparatus of the present invention for producing the aligned carbon nanotube aggregates, may include: a formation unit for causing the catalyst to be surrounded by the reducing gas environment constituted by the reducing gas, and heating at least either the catalyst or the reducing gas; a growth unit for growing the aligned carbon nanotube aggregate by causing the catalyst to be surrounded by the raw material gas environment constituted by the raw material gas, and heating at least either the catalyst or the raw material gas; and a transfer unit for transferring the substrate at least from the formation unit to the growth unit.

Further, the apparatus of the present invention for producing the aligned carbon nanotube aggregates, may include a formation unit for causing the catalyst to be surrounded by the reducing gas environment constituted by the reducing gas, and heating at least either the catalyst or the reducing gas; a growth unit for growing the aligned carbon nanotube aggregate by causing the catalyst to be surrounded by the raw material gas environment constituted by the raw material gas, and heating at least either the catalyst or the raw material gas; and a transfer unit for transferring the substrate at least from the formation unit to the growth unit.

INDUSTRIAL APPLICABILITY

The present invention makes it possible to prevent a decrease in production quantity and deterioration in quality of aligned CNT aggregates in serial production, and makes it easy to increase the size of a production apparatus, thereby being suitably applicable to fields of electronic device materials, optical element materials, conducting materials and like materials.

REFERENCE SIGNS LIST

101: Inlet purge section
102: Formation unit
102a: Formation furnace
102b: Reducing gas ejection section
102c: Heater
103: Gas mixing prevention means
103a to 103c: Exhaust section
104: Growth unit
104a: Growth furnace
104b: Raw material gas ejection section
104c: Heater
105: Cooling unit
105a: Cooling furnace
105b: Coolant gas ejection section
105c: Water-cooled cooling tube
106: Outlet purge section
107: Transfer unit
107a: Mesh belt
107b: Belt driving section
108 to 110: Connection section
111: Catalyst substrate (substrate)
301: Catalyst substrate (substrate)
304: Synthesizing furnace
305: Heater
302: Substrate holder
303: Gas ejection section
306: Exhaust vent

The invention claimed is:
1. An apparatus for producing aligned carbon nanotube aggregates,
the apparatus being configured to grow the aligned carbon nanotube aggregate by:
causing a catalyst formed on a surface of a substrate to be surrounded by a reducing gas environment constituted by a reducing gas;
heating at least either the catalyst or the reducing gas;
causing the catalyst to be surrounded by a raw material gas environment constituted by a raw material gas; and
heating at least either the catalyst or the raw material gas,
at least either an apparatus component exposed to the reducing gas or an apparatus component exposed to the raw material gas being made from a heat-resistant alloy, and having a surface plated with molten aluminum so as to have, between a base material, which is the heat-resistant alloy, and aluminum, an alloy layer of the heat-resistant alloy and aluminum,
the apparatus comprising:
a formation unit for causing the catalyst to be surrounded by the reducing gas environment constituted by the reducing gas, and heating at least either the catalyst or the reducing gas;
a growth unit for growing the aligned carbon nanotube aggregate by causing the catalyst to be surrounded by the raw material gas environment constituted by the raw material gas, and heating at least either the catalyst or the raw material gas; and
a transfer unit for transferring the substrate at least from the formation unit to the growth unit,
the formation unit including a formation furnace in which the reducing gas is retained, a reducing gas ejection section for ejecting the reducing gas, and a heater for heating at least either the catalyst or the reducing gas,
the growth unit including a growth furnace in which the raw material gas is retained, a raw material gas ejection section for ejecting the raw material gas, and a heater for heating at least either the catalyst or the raw material gas,
the transfer unit including a mesh belt and a belt driven section,
one of the apparatus components which have been plated with molten aluminum being the growth furnace, in which an environment of high-carbon concentration is retained, the environment of high-carbon concentration being an environment in which a proportion of the raw material gas to a total flow is approximately 2% to 20%,
wherein the base material, which is the heat-resistant alloy, includes at least one selected from the group consisting of a heat-resistant steel, stainless steel, and a nickel-based alloy, and wherein the apparatus component is not the substrate.

* * * * *